United States Patent [19]

Kawamata et al.

[11] Patent Number: 5,351,027
[45] Date of Patent: Sep. 27, 1994

[54] MAGNETIC SENSOR

[75] Inventors: Syooichi Kawamata; Tadashi Takahashi; Shigeki Morinaga, all of Hitachi, Japan

[73] Assignee: Hitachi, Ltd., Tokyo, Japan

[21] Appl. No.: 852,663

[22] Filed: Mar. 17, 1992

[30] Foreign Application Priority Data

Mar. 20, 1991 [JP] Japan .................................. 3-56296

[51] Int. Cl.⁵ .......................................... H01L 43/00
[52] U.S. Cl. .................................. 338/32 R; 324/252
[58] Field of Search ................. 338/32 R; 324/207.21, 324/252

[56] References Cited

U.S. PATENT DOCUMENTS 3,967,368  7/1976  Brock et al. .
4,506,220  3/1985  Sawada et al. .
4,613,918  9/1986  Kanai et al. ................... 338/32 R X

FOREIGN PATENT DOCUMENTS

62-099911  5/1987  Japan .
63-164013  7/1988  Japan .
2125679    5/1990  Japan .

Primary Examiner—Marvin M. Lateef
Attorney, Agent, or Firm—Antonelli, Terry, Stout & Kraus

[57] ABSTRACT

A magnetic sensor has a elongate sensor region formed by an elongate magneto-resistive element and an overlapping elongate conductive element. The ends of the magneto-resistive element and the conductive element are connected to terminals which are arranged in an array which is spaced in a predetermined direction from the elongate sensor region. The array may be at one side or one end of the elongate sensor region, and the terminals may have a linear arrangement within the array. The two terminals connected to the magneto-resistive element are preferably adjacent, and preferably the terminals connected to the ends of the magneto-resistive element and the conductive element closer to the array are also adjacent. A common terminal may be provided. Two such sensors may form a sensor array which is particularly suitable for use in a position sensor in e.g. a torque sensor of a power steering system.

24 Claims, 11 Drawing Sheets

MAGNETIC SENSOR

BACKGROUND OF THE INVENTION

1. Field of the Invention

The present invention relates to a magnetic sensor making use of a magneto-resistive element, to a position sensor incorporating such a magnetic sensor, and to various devices and systems incorporating such a position sensor.

2. Summary of the Prior Art

It is well known that certain materials, known as magneto-resistive materials, have the property of changing their resistance with changes in ambient magnetic fields. By passing a current through such a magneto-resistive element, and monitoring the changes in voltage across the element, it is possible to monitor changes in magnetic fields. Such a magnetic sensor is disclosed in, e.g. JP-A-58-56485 and JP-A-63-96713.

One disadvantage of a magnetic sensor as described above is that accurate measurement is affected by e.g. hysteresis of the magneto-resistive element. Therefore, it has been proposed to form a conductive element immediately adjacent the magneto-resistive element so that one element was superposed on the other. Then, a current was passed through the conductive element, which current generated a magnetic field. Of course, that magnetic field would then affect the magneto-resistive element, and therefore, by varying the currents through the conductive element, and hence the magnetic field generated, it became possible to arrange for the net magnetic field experienced by the magneto-resistive element to remain constant. Hence, the changes in current through the conductor needed to achieve this gave a measurement of the changes in ambient magnetic field.

SUMMARY OF THE PRESENT INVENTION

The present invention proposes to make use of a magnetic sensor with an elongate sensor region comprising a elongate magneto-resistive element and an elongate conductive element superposed one on the other. Normally, it is easiest if the conductive element is above the magneto-resistive element, but this is not essential to the present invention.

The present invention is particularly concerned with the arrangements of the terminals to which ends of the elongate magneto-resistive element and conductive element are electrically connected. According to the present invention, these terminals form an array which is in a predetermined direction from the elongate sensor region. Thus, the array of terminals lie on one side or end of the sensor region, making the electrical connection thereto straightforward.

Normally, the terminals have a linear arrangement, but other shapes are also possible.

It is also preferable that the terminal array is spaced from one end of the sensor region, but it is also possible for it to be at the side of the sensor region.

Although many different terminal arrangements are possible within the terminal array, there are some which offer particular advantages. These arrangements may be divided into two groups; those in which there are four terminals, with two being connected to the respective ends of the magneto-resistive element and two being connected to the two ends of the conductive element, and those arrangements in which there is one or more common terminals.

In either case, it is generally preferably for the terminals connected to the magneto-resistive element to be adjacent in the array, as there then needs to be no overlap of the leads connecting those terminals to the ends of the magneto-resistive arrangement with the leads connecting the terminals to the ends of the conductive element. This avoidance of overlap reduces or eliminates the risk of shorting between the leads to the conductive element and the magneto-resistive element. Normally, such leads are separated by a suitable insulator layer, but, if by some malfunction of the manufacturing process, that insulator layer is too thin, overlapping leads may short. This can therefore be achieved by suitable arrangement of the terminals.

It is normally also preferable that the terminals which connect the adjacent ends of the magneto-resistive element and the conductive element are also adjacent. This is particularly advantageous where the array of terminals is closest to that end, since the leads from the terminals to those ends can then be short in length. Of course, the leads to the other ends may then be long, but the arrangement can be operated in which those longer leads are grounded. Again, the terminals which had varying signals have short leads thereto, and this offers good noise resistance.

As was mentioned above, it is possible for there to be a common lead or leads connected to adjacent ends of the magneto-resistive element and conductive element. In this case, it is preferable that that common terminals connected to the part of the sensor region remote from the terminal array, so that there is a long common lead connecting that end to the terminal. This long common lead also suppresses noise. This idea may be developed further by having two common terminals, one on each end of the terminal array, with long common leads extending from the terminal array to the remote end of the sensor region. Those common leads may then lie on both sides of the sensor region, which improves the noise suppression further.

A further advantage is offered by making the leads from the terminals to the sensor region relatively wide, i.e. having a transverse width which is greater than the transverse width of the elongate magneto-resistive element. This is particularly important for the common lead. The reason for having such wide tracks is that narrow tracks are more affected by the magnetic field, and therefore more likely to cause error.

In a further development of the present invention, a magnetic sensor array is formed comprising two or more magnetic sensors having some or all of the features discussed above.

In such a magnetic sensor array, one corresponding end of each sensor region may be connected in common, preferably, those ends of the sensor array which are remote from the terminal array. It may be noted that, in such an arrangement, it is preferable for the two terminal arrays of each magnetic sensor to form a single enlarged array.

This use of common terminals in each magnetic sensor may be applied to the ends of the magneto-resistive element of each sensor and/or to the ends of the conductive element of each sensor, or all such ends may be connected in common.

The present invention is particularly, but not exclusively, applicable to a position sensor comprising a track of magnetic elements having a predetermined pitch, with the magnetic sensor being placed adjacent that track for detecting the magnetic fields generated by those magnetic elements. If the track moves relative to the sensor, the changes in magnetic fields can be detected by the change in resistance of the magneto-resistive element.

Normally, assuming the track is moving transverse to the elongate sensor region, at least the magneto-resistive element is a width which is less than the pitch of the magnetic elements.

Such an arrangement may also make use of the magnetic sensor array mentioned earlier, using two or more sensors, in which case the sensor regions are spaced apart by less than the pitch of the sensitive elements.

Such a position sensor may then be applied to a motor control apparatus, a torque sensor, or to, e.g., a power steering arrangement involving such a torque sensor.

BRIEF DESCRIPTION OF THE DRAWINGS

Embodiment of the present invention will now be described in detail, by way of example, with reference to the accompanying drawings, in which.

DETAILED DESCRIPTION

The basic operation of a magnetic sensor according this invention will first be explained with reference to FIGS. 1 and 2.

Figure 1:
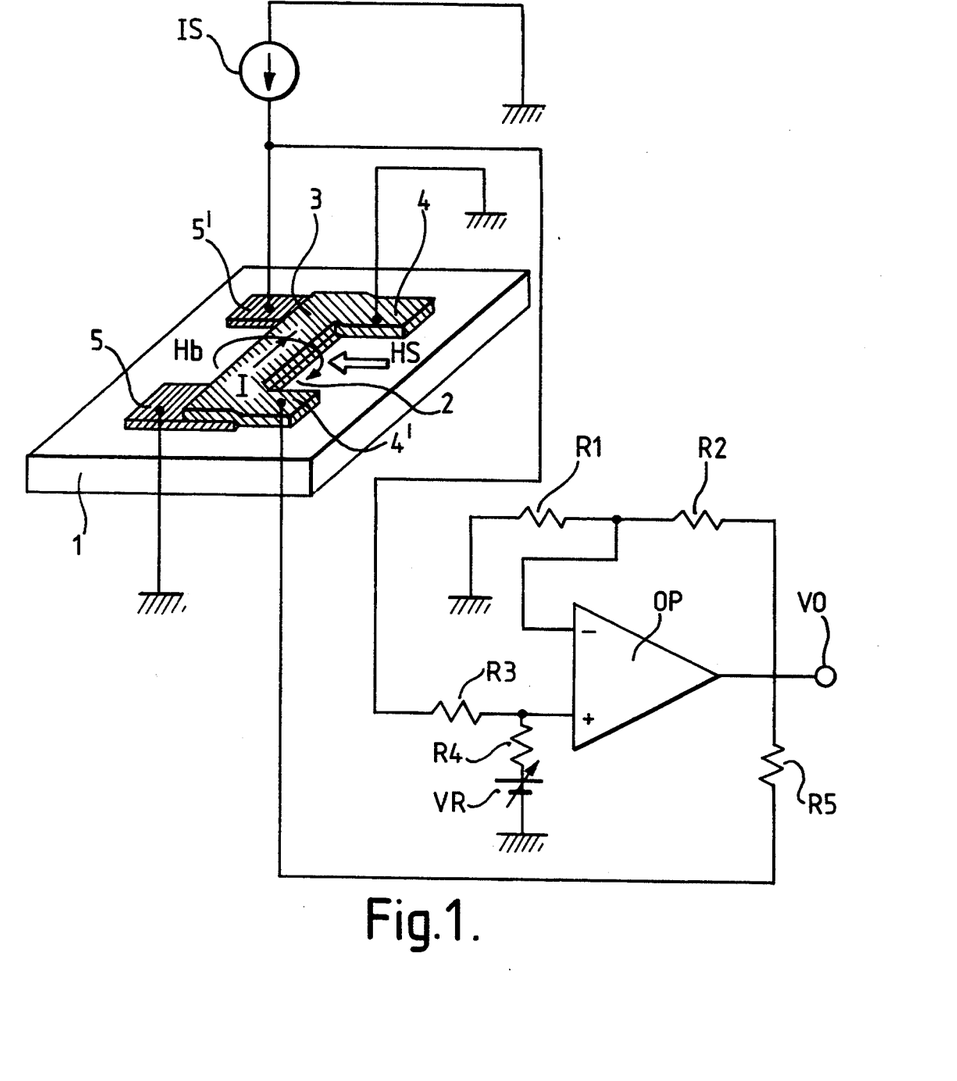
FIG. 1 is a basic circuit diagram of a variable bias type magnetic sensor.

FIG. 1 shows the configuration view of a variable bias magnetic sensor having an insulating substrate 1. A magneto-resistive element 2 which is a ferromagnetic substance is placed on this insulating substrate 1 and terminals 5 and 5' are formed on respective ends of the magneto-resistive element. One terminal 5' is connected to the positive input of an amplifier OP via a constant current source IS grounded (earthed) at one side and resistor R3. The other terminal 5 is grounded (earthed). A conductor 3 is located over the magneto-resistance element 2 via an insulating substance (not shown) and this has terminals 4 and 4'. One of these terminals 4' is connected to amplifier output through a resistor R5 and other terminal 4 is grounded (earthed). Resistors R1 and R2 are connected to the negative output of the amplifier OP while the other end of the resistor R1 is grounded and the other end of the resistor R2 is connected to the output terminal of the amplifier OP. A variable voltage source VR is connected to the positive input terminal of the amplifier OP via a resistor R4 and the other end is grounded. Then, the sensor output VO corresponds to the output of the amplifier OP.

The operation of the variable bias magnetic sensor having such a configuration will now be explained.

Assume that the variable voltage source VR is at zero 0 when a signal magnetic field HS to be applied to this sensor is zero 0, the constant current IS and the voltage obtained by the resistor RO of the magneto-resistive element are applied to amplifier output, so that the amplifier OP outputs an amplified voltage VO. Consequently, a current I flows through the conductor so that a bias magnetic field Hb is generated as shown in FIG. 1, which bias magnetic field Hb acts on the magneto-resistive element 2. As a result, the resistance of the magneto-resistive element 2 decreases and at the same time, the input voltage of the amplifier OP decreases. Consequently, the bias current I decreases and the bias magnetic field Hb decreases. Eventually, a steady-state bias magnetic field HbO is reached. This assumes that the signal magnetic field HS is constant.

Figure 2:
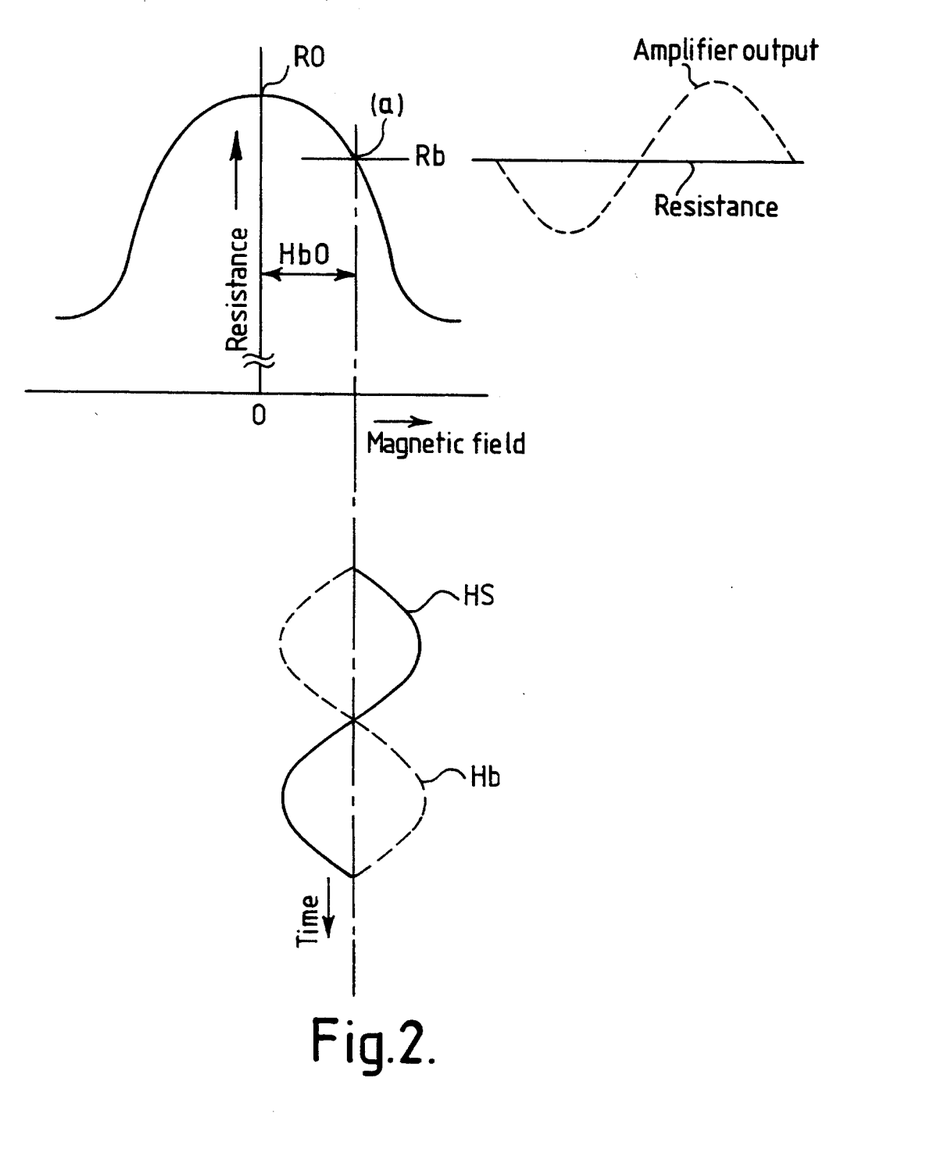
FIG. 2 shows the operation of a variable bias type magnetic sensor.

FIG. 2 shows the relationship between resistance and the magnetic field of the magneto-resistive element 2. The horizontal axis indicates the magnetic field generated perpendicular to the current I and the vertical axis shows the electric resistance of the magneto-resistive element 2. This characteristic is the same when the magnetic field is reversed. With the bias magnetic field HbO the operating point is (a) in FIG. 2 and the magnetic-resistive effect element 2 operates as shown by curve Rb.

Assuming that the signal magnetic field HS shown in Fig.1 is applied to the magneto-resistive element 2, the magnetic field of the magneto-resistive element 2 attempts to increase, so that the resistance Rb attempts to decrease. Consequently, the input voltage of the amplifier OP decreases so as to reduce the amplifier output VO. Then, the current I flowing through the conductor decreases so as to reduce the bias magnetic field Hb. As a result, the bias magnetic field Hb is reduced by the same amount as the increase of the signal magnetic field HS and the net field experienced by the magneto-resistive element remains unchanged.

Assume now that the signal magnetic field HS changes in the reverse direction. Then the magnetic field applied to the magneto-resistive element 2 decreases so that the resistance Rb attempts to increase, thereby increasing the amplifier OP input, and the amplifier output VO. Consequently, the current I in the conductor 3 increases so as to increase the bias magnetic field. The increase in the bias magnetic field Hb is then the same as the increase in the signal magnetic field HS, so that the net magnetic field stays constant. Hence, despite changes in signal magnetic field HS the resistance of the element 2 is equal to Rb and the operating point does not change from point (a) in FIG. 2. However, the output VO of the amplifier 0P changes corresponding to the signal magnetic field HS.

Because this sensor also operates in the same manner as described above when the signal magnetic field Hs changes with time as shown in FIG. 2, the bias magnetic field Hb changes so that its intensity is equal to the signal magnetic field HS and its direction is reverse as shown by the broken lines in FIG. 2. Thus the magnetic field to be applied to the magneto-resistive element 2 is always a synthesis of both the signal magnetic field HS and the bias magnetic field Hb there is a constant net magnetic field and the operating point (a) does not move, so that the resistance stays as a constant of Rb. However, the output VO of the amplifier OP changes as shown by broken lines to produce an output corresponding to the signal magnetic field.

This arrangement thus avoids error due to hysteresis effects of the magneto-resistive element.

Figure 3:
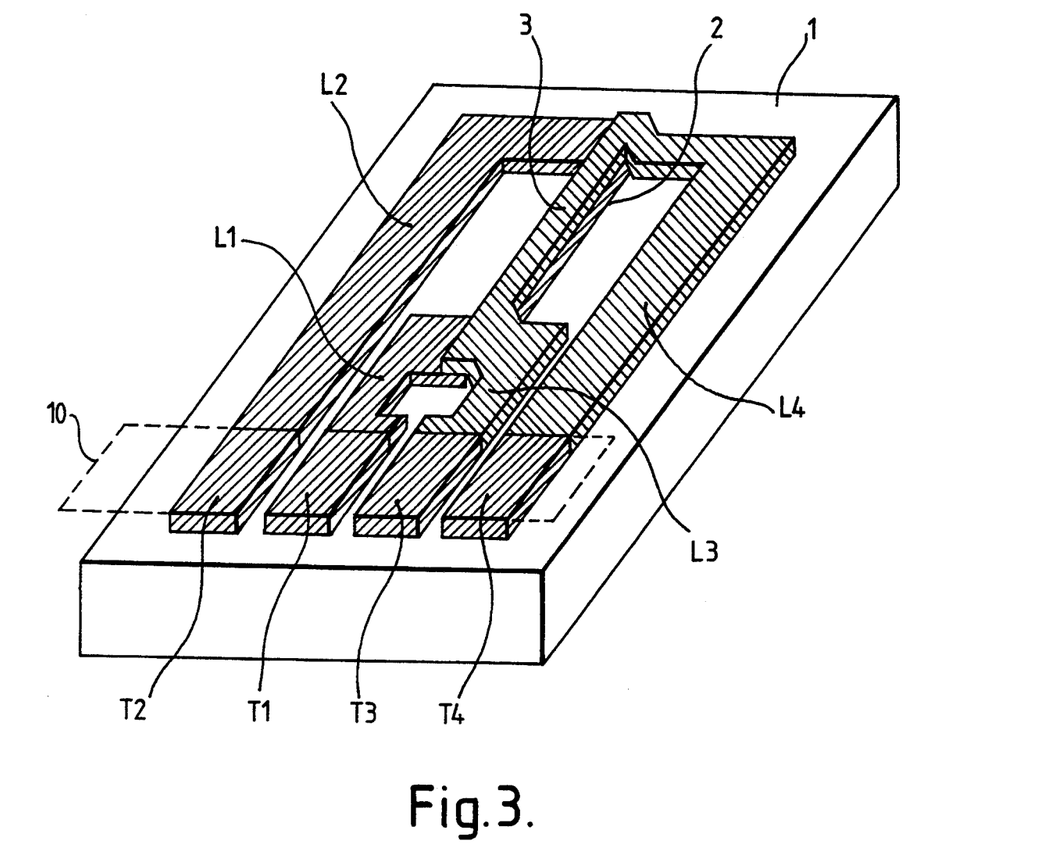
FIG. 3 is a plan view of a bias type magnetic sensor of the first embodiment of this invention.

The operating point (a) shown in FIG. 3 can be changed if the variable voltage source VR is changed (for example, incremented). Then, this variable voltage source VR is added to the amplifier input when the signal magnetic field HS is zero 0. Thus the bias magnetic field HbO can be increased by incrementing output voltage VO correspondingly. Hence, the operating point (a) can be set by the variable voltage source VR.

Because the variable magnetic sensor operating as described above can secure a one-phase output by a single magneto-resistive element, the number of the magneto-resistive elements can be kept small thereby making it possible to reduce the size of the magnetic sensor. For this purpose, the wiring for the power supply and output of the magneto-resistive element 2 and conductor 3 is an important key point.

FIG. 3 is a first embodiment of the present invention, with parts corresponding to those of FIG. 1 being indicated by the same reference numerals.

Terminals T1 to T4 arranged in a linear array 10 on an insulating substrate 1, and used as power terminals for supplying power to the magneto-resistive element 2 and conductor 3 and the output terminals for output from the magneto-resistive element 2 and conductor 3. The magneto-resistive element 2 is on the insulating substrate 1 (for example, of glass) is connected to leads L1 and L2 which in turn are connected to terminals T1 and T2.

One end of the magneto-resistive element 2 (that end adjacent the terminal array 10) is connected to the terminal T1 via the lead L1 and is of the same material. The other end of the magneto-resistive effect element 2 (furthest from the terminal array 10) is connected to the terminal T2 via lead L2, so that the leads L1 and L2 do not intersect each other. These leads L1 and L2 have a larger width than that of the magneto-resistive element 2 so as to minimize the effect of the resistance of the leads. In the embodiment of FIG. 3, terminal T2 is at an outer point of the terminal array.

The conductor 3 is located on and in parallel to the magneto-resistive element 2 via an insulating substance (not shown). The leads L3 and L4 to this conductor 3 are of the same material as the conductor 3 (for example), and connected to the terminals T3 and T4 so that they do not intersect leads L1 and L2.

One end (adjacent the terminal array 10) of the conductor 3 is connected to the terminal T3 immediately to the right of the terminal T1. The other end of ( furthest from the terminal array 10 ) the conductor 3 is connected to lead L4 which extends to an outermost terminal T4 of the terminal array. Thus, in this configuration, the terminals 5, 5', 4' and 4 in FIG. 1 correspond respectively to the terminals T1, T2, T3 and T4 in FIG. 3.

Thus, comparing the functions of the terminals T1 to T4 with FIG. 2, terminal T2 is connected to the positive input of the amplifier OP via the constant current source IS and resistor R3. The terminal T1 is connected to the ground line of the circuit. The terminal T3 is connected to the output of the amplifier OP via the resistor R5. The terminal T4 is connected to the ground line of the circuit.

As explained above, in a variable bias magnetic sensor according to this invention, the number of the terminals can be reduced to four in a single phase of sensor output, and those terminals form a terminal array spaced from the magneto-resistive element 2, and the size can be reduced, thereby improving the yield rate.

Alternatively, by changing the polarity of current source IS terminal T2 may be grounded and terminal T1 connected to the current source IS.

Figure 4:
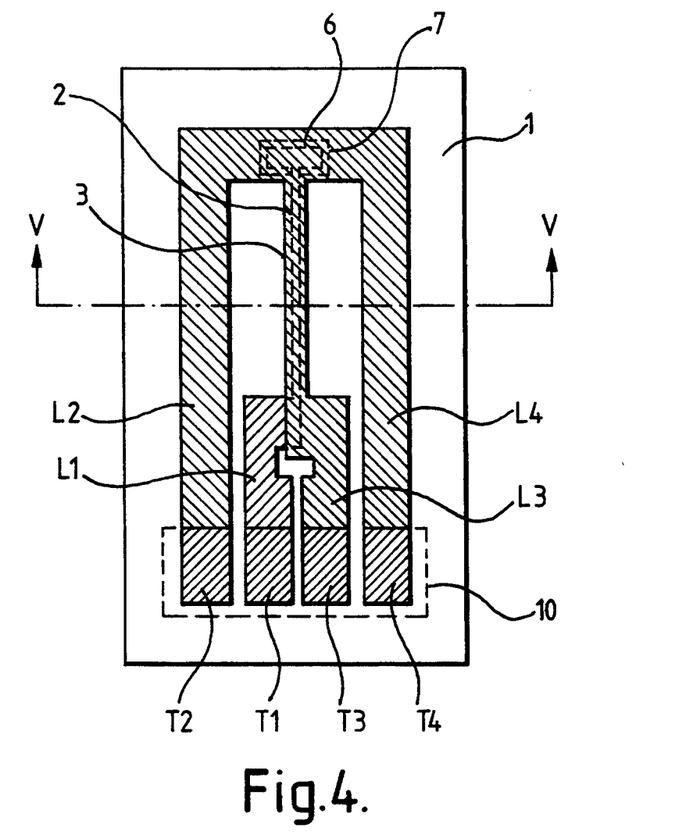
FIG. 4 shows the configuration of a second embodiment of a bias type magnetic sensor according to the present invention.
Figure 5:
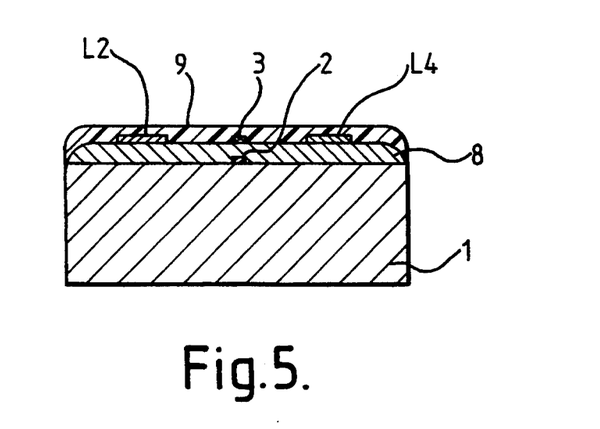
FIG. 5 shows a cross-sectional view along the line V—V in FIG. 4 indicating a sectional view of the bias type magnetic sensor.

FIG. 4 shows the configuration of a second embodiment, where the conductor 3 is electrically connected to the end 6 of the magneto-resistance effect element 2 remote from the terminal array 10 via a through hole 7 in the insulating material 8 (see FIG. 5)

The magneto-resistive element 2 is located on the insulating substrate 1 (for example, of glass) together with the lead L1 and the conductor 3, together with the leads L2 and L4 is separated from the magneto-resistive element 2 by the insulating material 8. The wirings L2 and L4 are outermost and connected to the terminals T2 and T4. This construction enables the lead L2 to be formed of the same material (for example, aluminium) as the conductor 3 and leads L4 and the resistance of the wiring to be reduced. Hence, the magneto-resistive element 2 and conductor 3 may be at least partially surrounded by a ground line, thereby improving the noise resistance.

In FIG. 5, the magneto-resistive element 2, and leads ( L1 FIG. 4) are formed of thin film such as NiFe on the insulating substrate ( for example, glass ) 1 by deposition, sputtering and etching. Then, the insulating material 8, such as $SiO_2$, is formed on that film. Then, the conductor 3, e.g., of aluminium and the leads L2, L3 and L4 are formed. To protect these parts from damage and deterioration, a resin protective film polyimido-isoindroquina-zolinedione (generally called PIQ) is formed on the insulating material 6.

Figure 6:
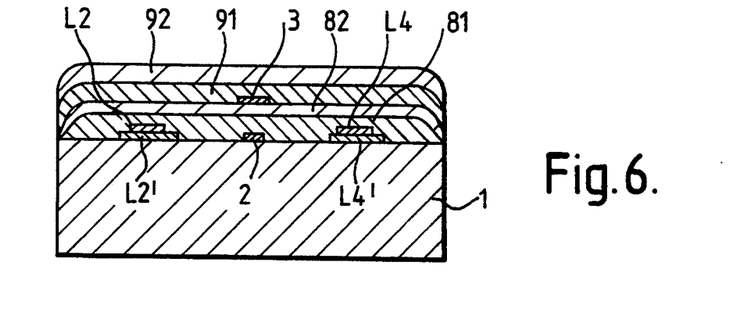
FIG. 6 shows a cross-sectional view through a modification of the sensor of FIGS. 4 and 5.

FIG. 6 shows a structure to improve that protection.

In FIG. 6, the magneto-resistive element 2 formed of Permalloy (NiFe) and leads L2' and L4' formed of chrome, etc. are carried on the glass substrate. On the chrome leads L2', L4' further leads L2 and L4 are formed of aluminium. The reason for placing chrome under the leads L2 and L4 is to enhance the noise resistance as well as to hold the leads L2 and L4 more firmly to the glass.

Then, the leads L2', L4', L2 and L4, and the magneto-resistive element 2 are covered with the insulating material 81 such as SiO2, and further covered with a resin protective film 82 of polyimido-iso-indroquinazolinedione (hereinafter called PIQ).

The conductor 3 is formed on this resin protective film 82 and covered with insulating material 91 such as SiO2 and further resin protective film 92, again e.g. of PIQ covers the result.

Figure 7:
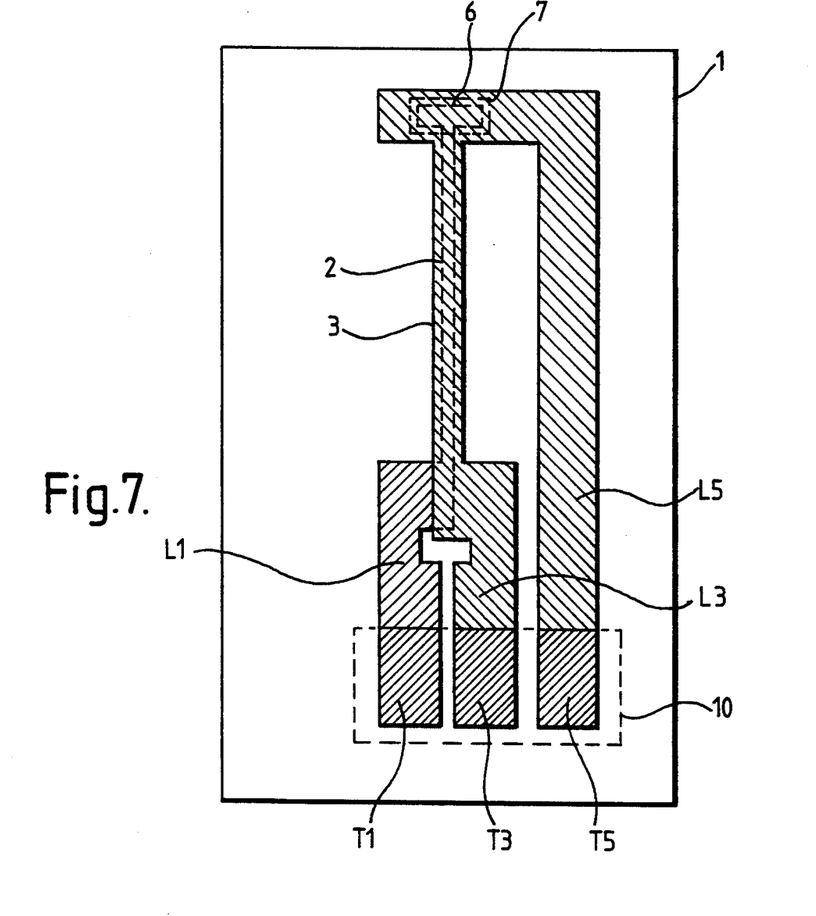
FIG. 7 shows the configuration of a third embodiment of a bias type magnetic sensor according to the present invention.

This protective configuration enables the magnetic sensor of this invention to offer good protection to the magneto-resistive element 2 and conductor 3 from a shock, chemical corrosion and water. FIG. 7 is a further embodiment of this invention. In the embodiments of FIGS. 1 to 4, the ends of the conductor 3 and magneto-resistive element 2 furthest from the terminal array 10 are connected (either individually or in common) to leads L2, L4 extending to the right and left and connected to terminals T2,T4 at both the extreme ends of the terminal array. However, in this example, either the terminal T2 or T4 limits further reducing the size of the magnetic sensor. In FIG. 7, the terminal T2 and T4 are replaced by terminal T5, the lead T4 replaced by lead L4, and the lead L2 shown in FIG. 4 removed to reduce further the size of the magnetic sensor, by reducing the number of terminals to three. Terminal T5 then acts as a common terminal for both the magneto-resistive element 2 and the conductor 3.

The examples shown in FIGS. 1 to 6 have a single sensor, giving an output of a single phase. However, when applied to a position sensor, such a sensor may not give a sufficiently good performance.

Figure 8:
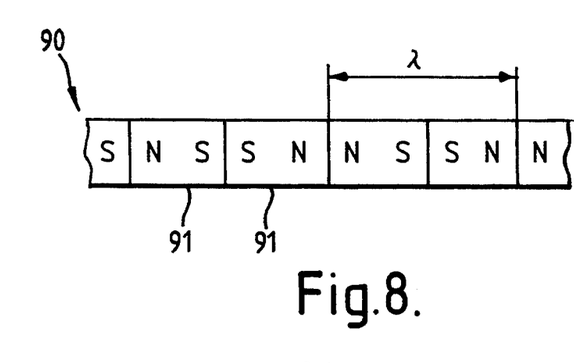
FIG. 8 shows a magnetic signal on a magnetic drum.
Figure 9:
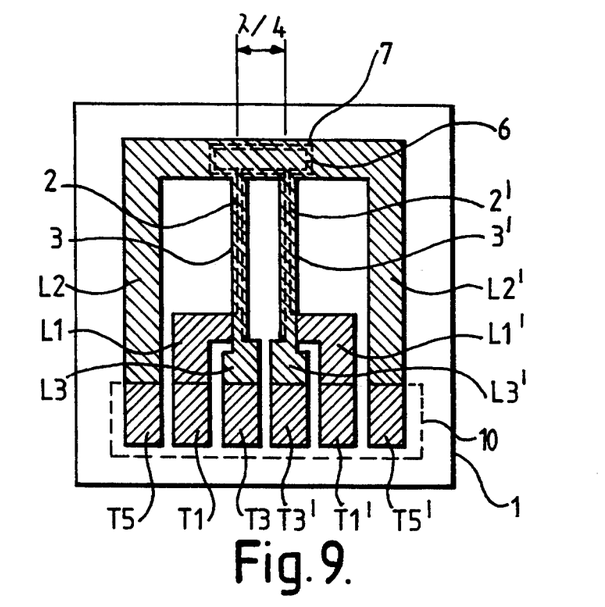
FIG. 9 shows a fourth embodiment of the present invention, being a variable bias type magnetic sensor array.
Figure 10:
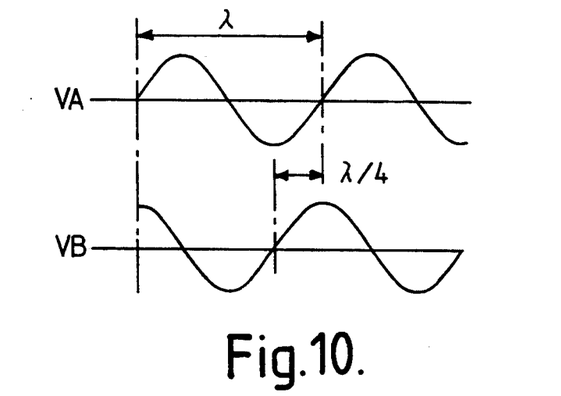
FIG. 10 shows the 2-phase output obtained from the fourth embodiment.

FIGS. 8 to 10 show an embodiment with two phase outputs. FIGS. 8 and 10 show an arrangement in which a magnetic sensor array is formed by two magnetic sensors each corresponding to that of FIG. 6 but one being mirror reversed. The magneto-resistive effect element 2' of one sensor is spaced from the magneto-resistive element 2 of the other sensor by a distance which is an integral multiple of $\lambda/4$ (where: $\lambda$ the recording wavelength N—N of a moving object 90 in which magnetic elements 91 (N—S) of a predetermined pitch ($\lambda/2$) are recorded. The conductors 3 and 3' and the wirings L2, L3, L3' and L2' are formed on insulating material (not shown) provided with a through hole 7.

Such an arrangement produces outputs VA and VB, with waveforms shown in FIG. 10 corresponding to the same signal magnetic field. The phase difference between the outputs VA and VB is 90 degrees at an electric angle corresponding to the interval $\lambda/4$ between the magneto-resistive element 2 and magneto-resistive element 2'.

In the embodiment of FIGS. 8 to 10, all the terminals of both sensors form a single terminal array 10 at one end of each sensor.

Figure 11:
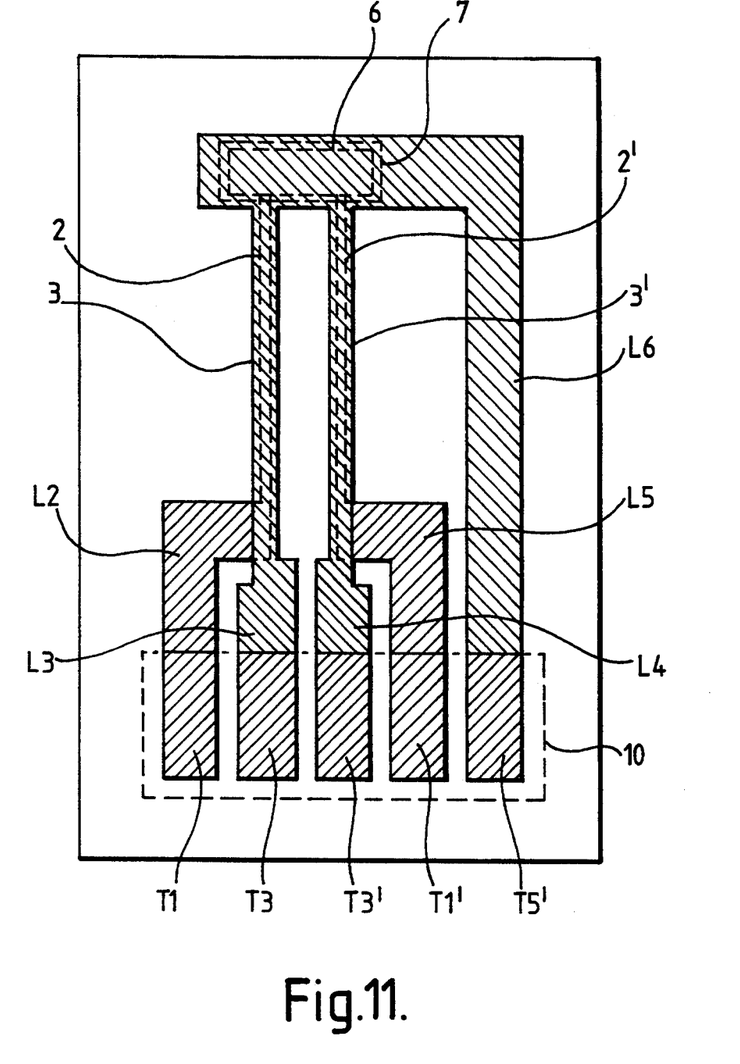
FIG. 11 shows a fifth embodiment of a variable bias type magnetic sensor array according to the present invention.

FIG. 11 shows another embodiment with 2-phase output. This is an embodiment in which the lead L2 shown in FIG. 9 is removed to omit the terminal T5 omitted so that terminal T5' acts as a common terminal for the magneto-resistive element 2,2' and conductor 3,3' of both sensors of the sensor array. This configuration can permit a further reduction of the size of the 2-phase output variable bias magnetic sensor.

Figure 12:
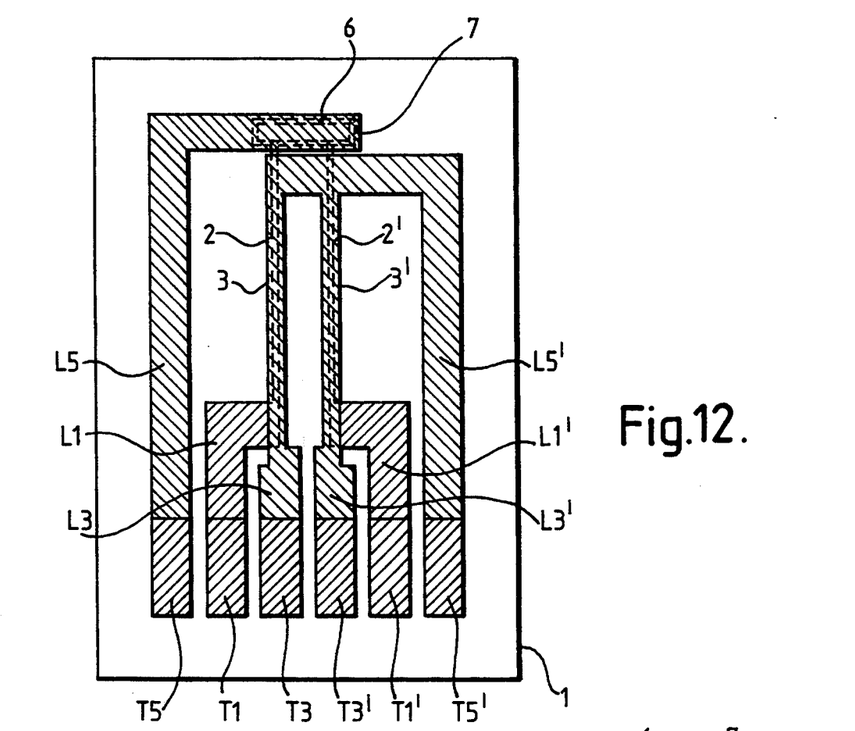
FIG. 12 shows a sixth embodiment of a variable bias type magnetic sensor array according to the present invention.

FIG. 12 shows a further embodiment of a magnetic array giving 2-phase output. In this embodiment, the magneto-resistive elements 2 and 2' are insulated electrically from the ground lead L5' of the conductors 3 and 3'. The lengths of the magneto-resistive elements 2 and 2' are greater than those of the conductors 3 and 3' and the ends 6 thereof are separated from the lead L5' of the conductors 3 and 3'. As a result, the magneto-resistive elements 2 and 2' are electrically insulated from the conductors 3 and 3', so that the magneto-resistive elements 2 and 2' are not affected by the current flowing through the conductors 3 and 3'. This forms a highly reliable variable bias type magnetic sensor. Although the magneto-resistive elements 2 and 2' are longer than the conductors 3 and 3' in this embodiment, it also possible to make the conductors 3 and 3' longer. In this case, the best use is made of the full length of the magneto-resistive elements 2 and 2'.

Figure 13:
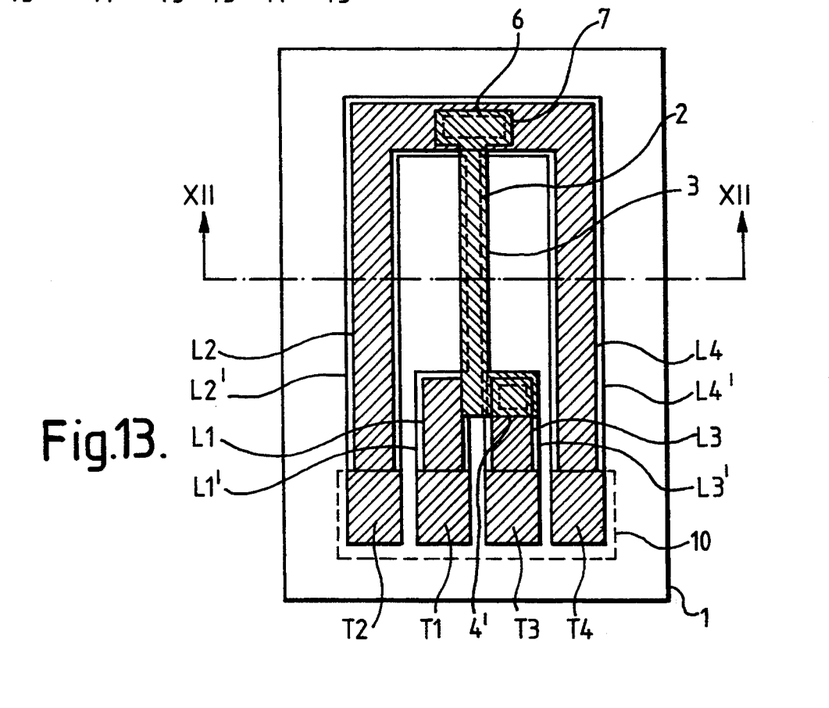
FIG. 13 illustrates a seventh embodiment of the variable bias type magnetic sensor.
Figure 14:
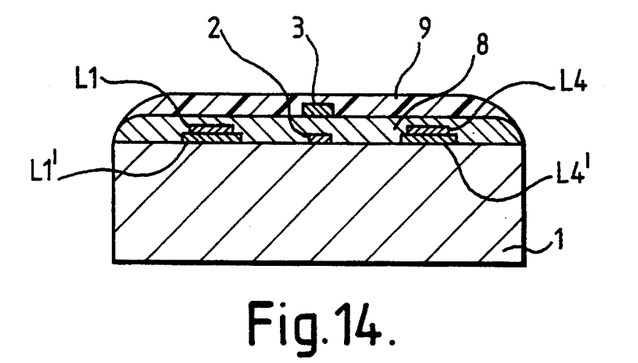
FIG. 14 is a cross sectional view along the line XII—XII in FIG. 13.

FIG. 13 shows the configuration of a magnetic array of a further embodiment of this invention, incorporating the ideas of FIG. 6. FIG. 14 then corresponds to the cross section XII—XII. In this embodiment, the leads have two parts and the first leads L1', L2', L3' and L4' are formed of a material such as chrome having an excellent adhesion to insulating substrate 1 ( for example, of glass), then leads of a more conductive material such as aluminium are formed on the chrome. With this example, there is insulating material 9 on the surface to improve the sensor reliability by protecting the conductor 3.

As mentioned with reference to FIGS. 1 to 14, the combinations of the above embodiments may be produced depending on the purpose for application for the sensor.

Figure 15:
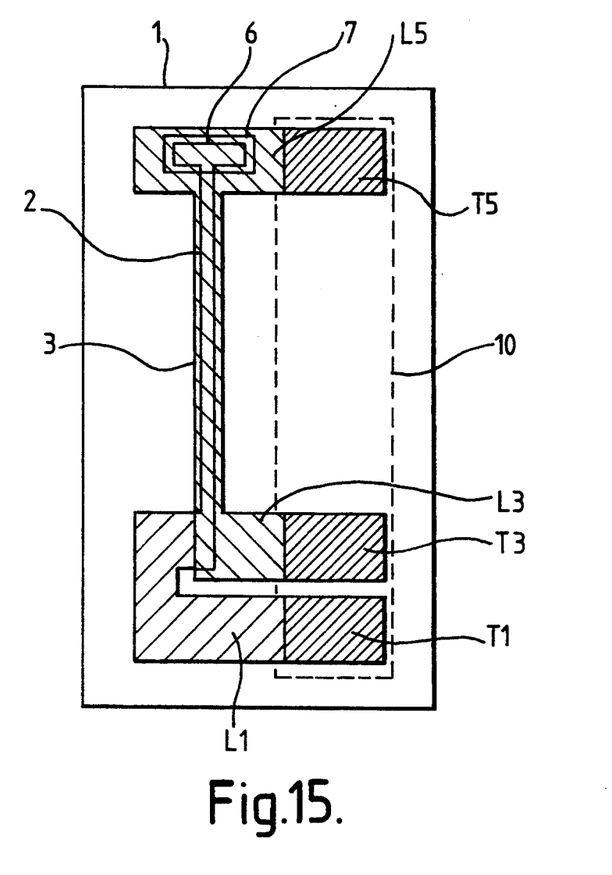
FIG. 15 illustrates an eighth embodiment of the present invention, which the terminal array is at the side of the sensor.
Figure 16:
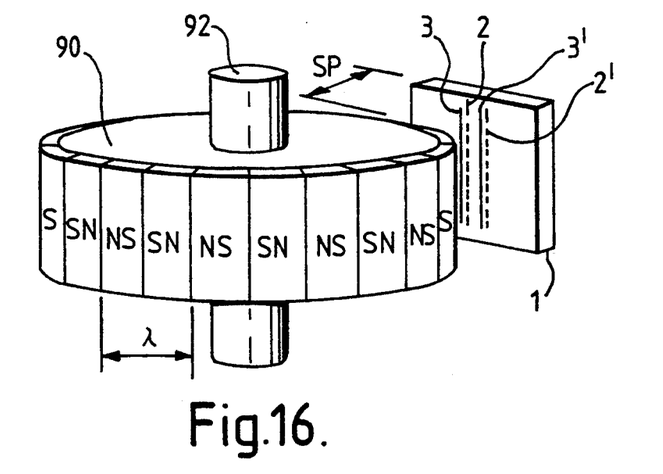
FIG. 16 is a perspective view of a position detecting apparatus for detecting magnetic signals from a magnetic drum mounted on a motor shaft.

In all the above embodiments, the terminal array 10 is spaced from the magneto-resistive element to an conductor 3 in a direction corresponding to the longitudinal direction of the magneto-resistive element 2, i.e. parallel to the direction from one end of the magneto-resistive element 2 to the other. However, it is also possible for the terminal array 10 to extend along one side of the magneto-resistive element 2, i.e., is spaced from that element in a direction transverse to the direction of elongation. An embodiment illustrating this is shown in FIG. 15. In the embodiment of FIG. 16, the arrangement of the terminals and leads corresponds to that of FIG. 7, and corresponding reference numerals are used.

This embodiment has the advantage that the common lead L5 is short, and so can have a small resistance. Furthermore, the length of the substrate 1 may be reduced. Furthermore, it can be seen that the size of the terminal array 10 is larger than in the embodiment of FIG. 7 which permits the terminals T1, T3 and T5 to be larger, so that it is easy to attach electrical connections thereto.

An example of a position detecting apparatus using a variable bias type magnetic sensor according to the present invention is shown in FIG. 16. FIG. 16 shows an example in which a variable bias type magnetic sensor is applied to a magnetic encoder of a rotary position detecting apparatus. Magnetic signals are recorded on the circumference of the magnetic rotary drum (magnetic medium) 90 fixed on a rotary shaft 92 with a recording wavelength ( N—N ) ( see also FIG. 8 ). A variable bias type magnetic sensor 1 according to the present invention is located adjacent the magnetic medium 90, spaced by a distance SP. When the magnetic drum rotates, a signal magnetic field (repeated signal of N—N) generated from the magnetic signal is applied to the variable bias type magnetic sensor 1. As a result, the signal magnetic field changes in a sinusoidal pattern with time, and a sinusoidal output is obtained as amplifier output VO as shown in FIG. 2. This output waveform is proportional to the signal magnetic field, and therefore, the rotation position can be detected accurately by this output.

Figure 17:
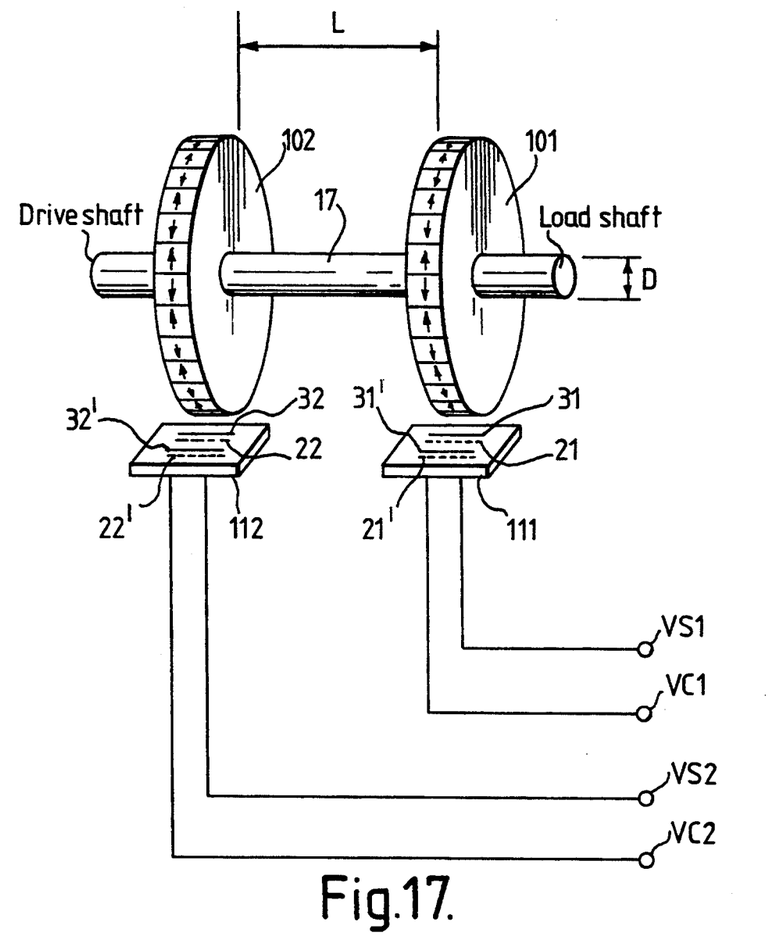
FIG. 17 is a perspective view of a torque sensor employing a position detecting apparatus.

FIG. 17 shows an example of a torque sensor for detecting torque by the differences in rotation position, which is equipped with two of the sinusoidal output position detecting apparatuses shown in FIG. 15 at each end of a torsion bar. According to this embodiment, magnetic drums 101 and 102 are mounted on each end of the torsion bar 17 which has a diameter D with the drums 101,102 being separated by a distance of L. Two variable bias type magnetic sensor devices 111 and 112 are placed adjacent each drum 101,102. The variable bias type magnetic sensor devices 111 and 112 have magneto-resistive elements 21/21' and 22/22', separated by a distance λ/4 and conductors for bias magnetic field 31/31' and 32/32' are placed over the magneto-resistive elements 21/21' and 22/22'.

When the magnetic drums 101 and 102 rotate, 2-phase sinusoidal outputs whose phase differs by 90 degrees the variable bias type magnetic sensor devices 111 and 112. These outputs are the sine waves VS1, VS2 and cosine waves VC1, VC2 and the angles 1 and 2 of each magnetic drum can be obtained from this 2-phase output. This difference of angle is proportional to the shaft torque, this apparatus can be used as a torque sensor. This apparatus can detect torque without contact and can obtain an accurate torque measurement both when the shaft 17 is stopped and when it is rotating.

Figure 18:
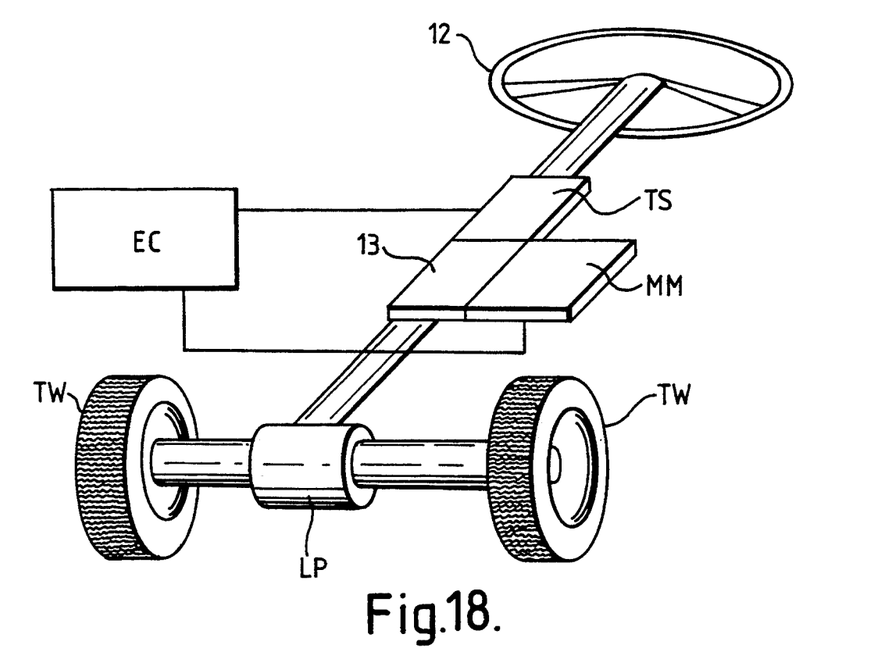
FIG. 18 is a perspective view of an electric power steering system employing a torque sensor.

FIG. 18 shows an example of using the torque sensor TS represented in FIG. 17 in the power steering of an automobile. The torque sensor shown in FIG. 17 is mounted via a shaft SH between the steering wheel 12 and reduction gear 13 so as to detect torque from the steering wheel 12. The drive motor MM is controlled on the basis of the torque by means of the control circuit EC so as to transmit an adjusting force corresponding to torque generated by the drive motor MM to the rack/pinion LP through the reduction gear 13 so as to change the direction of the drive wheels TW. This non-contact torque sensor TS gives a highly reliable power steering system.

Figure 19:
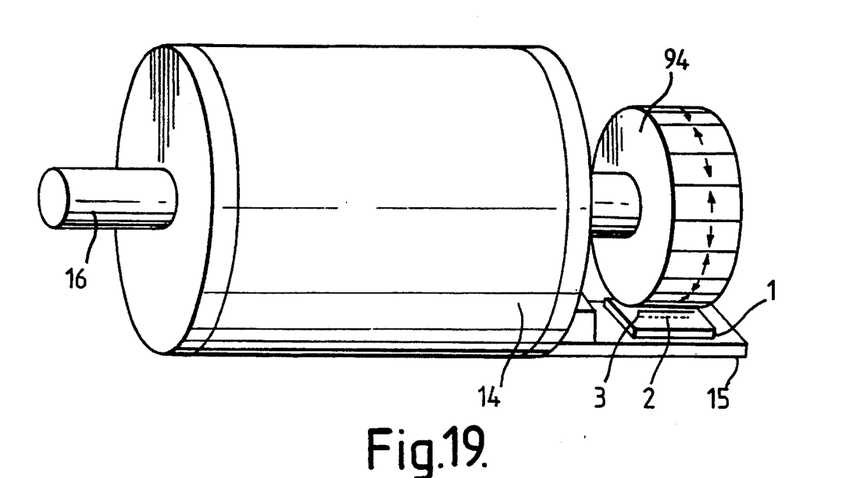
FIG. 19 is a perspective view of a motor equipped with a position detecting apparatus.

FIG. 19 shows an example of a rotary position detecting apparatus employing the position detecting apparatus shown in FIG. 16. In FIG. 19 there is a motor 14, a motor shaft 16, and a variable bias type magnetic sensor mounting base 15. A magnetic drum 94 is mounted on the motor shaft 16 so as to face the variable bias type magnetic sensor 1. When the motor 14 rotates, the variable bias type magnetic sensor 1 detects magnetic signals recorded on the magnetic drum 94, so that the rotary position of the motor 14 can be detected by the output of the variable bias type magnetic sensor 1. Thus this system is applicable as a servo motor for driving office automation appliance and factory automation equipment.

The present invention may thus provide one or more of the effects described below.

By connecting one end of a magneto-resistive element and a conductor as ground leads to terminals at the ends of a terminal array, the magneto-resistive element and conductor are partially surrounded by ground lines. Consequently, the resistance to disturbance from noise may be improved, so that a highly reliable sensor may be provided. Furthermore, by connecting in common either the magneto-resistive element and/or conductor and then providing a common terminal at both ends, one terminal can be omitted, therefore the size of the magnetic sensor can be reduced further.

A position detecting apparatus applying this variable bias type magnetic sensor is capable of obtaining a small, high precision sine wave.

By applying such a position detecting apparatus capable of detecting a position and speed so as to obtain a highly accurate sine wave, a motor capable of high precision control of a motor can be achieved.

A torque sensor employing such position detecting apparatus can obtain a small, highly accurate torque without contact, and further, an automobile power steering system using this torque sensor can be a highly reliable, stabilized system.

What is claimed is
1. A magnetic sensor comprising:
   an elongate sensor region, said elongate sensor region comprising an elongate magneto-resistive element having first and second ends and an elongate conductive element overlapping said elongate magneto-resistive element and having first and second ends; and
   a plurality of terminals electrically connected to said elongate sensor region for providing respective electrical connection to said first and second ends of said elongate magneto-resistive element and said elongate conductive element;
   wherein said terminals together form an array which is spaced from said elongate sensor region in a predetermined direction of elongation of said elongate magneto-resistive element.

2. A magnetic sensor according to claim 1, wherein said plurality of terminals have a linear arrangement within said array.

3. A magnetic sensor according to claim 1, wherein said plurality of terminals includes first and second terminals respectively connected to said first and second ends of said elongate magneto-resistive element and said first and second terminals are adjacent in said array.

4. A magnetic sensor according to claim 1, wherein said predetermined direction extends from said first end of said elongate magneto-resistive element away from said second end thereof.

5. A magnetic sensor according to claim 1, wherein said predetermined direction is perpendicular to said elongate sensor region.

6. A magnetic sensor according to claim 1, wherein said elongate magneto-resistive element is of ferromagnetic thin film.

7. A magnetic sensor as claimed in claim 1, further comprising:
   a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

8. A magnetic sensor comprising:

an elongate sensor region, said elongate sensor region comprising an elongate magneto-resistive element having first and second ends and an elongate conductive element overlapping said elongate magneto-resistive element and having first and second ends; and a plurality of terminals electrically connected to said elongate sensor region for providing respective electrical connection to said first and second ends of said elongate magneto-resistive element and said elongate conductive element;

wherein said terminals together form an array which is spaced in a predetermined direction from said elongate sensor region;

wherein said plurality of terminals include first and second terminals respectively connected to said first and second ends of said elongate magneto-resistive element and said first and second terminals are adjacent in said array;

wherein said plurality of terminals include third and fourth terminals respectively connected to said first and second ends of said elongate conductive element.

9. A magnetic sensor according to claim 4, wherein said first and third terminals are adjacent in said array.

10. A magnetic sensor as claimed in claim 4, further comprising:

a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

11. An magnetic sensor comprising:

an elongate sensor region, said elongate sensor region comprising an elongate magneto-resistive element having first and second ends and an elongate conductive element overlapping said elongate magneto-resistive element and having first and second ends; and a plurality of terminals electrically connected to said elongate sensor region for providing respective electrical connection to said first and second ends of said elongate magneto-resistive element and said elongate conductive element;

wherein said terminals together form an array which is spaced in a predetermined direction from said elongate sensor region;

wherein said first and second ends of said elongate magneto-resistive element are respectively adjacent said first and second ends of said elongate conductive element, and said terminals include at least one first terminal connected to said first end of said elongate magneto-resistive element and a third terminal connected to said first end of said elongate conductive element and said first and third terminals are adjacent in said array.

12. A magnetic sensor as claimed in claim 6, further comprising:

a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

13. A magnetic sensor comprising:

an elongate sensor region, said elongate sensor region comprising an elongate magneto-resistive element having first and second ends and an elongate conductive element overlapping said elongate magneto-resistive element and having first and second ends; and a plurality of terminals electrically connected to said elongate sensor region for providing respective electrical connection to said first and second ends of said elongate magneto-resistive element and said elongate conductive element;

wherein said terminals together form an array which is spaced in a predetermined direction from said elongate sensor region;

wherein said first and second ends of said elongate magneto-resistive element are respectively adjacent said first and second ends of said elongate conductive element, and said terminals include at least one fifth terminal connected in common to said second end of said elongate magneto-resistive element and said second end of said elongate conductive element.

14. A magnetic sensor according to claim 7, wherein said plurality of terminals include a first terminal connected to said first end of said elongate magneto-resistive element and a third terminal connected to said first end of said elongate conductive element.

15. A magnetic sensor according to claim 8, wherein said first and third terminals are adjacent.

16. A magnetic sensor according to claim 9, wherein said at least one fifth terminal comprises two terminals, and said first and third terminals are between said two terminals in said array.

17. A magnetic sensor as claimed in claim 7, further comprising:

a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

18. A magnetic sensor comprising:

an elongate sensor region, said elongate sensor region comprising an elongate magneto-resistive element having first and second ends and an elongate conductive element overlapping said elongate magneto-resistive element and having first and second ends; and a plurality of terminals electrically connected to said elongate sensor region for providing respective electrical connection to said first and second ends of said elongate magneto-resistive element and said elongate conductive element;

wherein said terminals together form an array which is spaced in a predetermined direction from said elongate sensor region:

further including a plurality of leads respectively connecting said plurality of terminals to said elongate sensor region, and each of said plurality of leads has a width which is greater than a transverse width of said elongate magneto-resistive element.

19. A magnetic sensor as claimed in claim 11, further comprising:

a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

20. A magnetic sensor array comprising a first magnetic sensor and a second magnetic sensor, each of said first and second magnetic sensors including:

an elongate sensor region, said elongate sensor region comprising an elongate magneto-resistive element having first and second ends and an elongate conductive element overlapping said elongate magnetic resistance element and;

a plurality of terminals electrically connected to said elongate sensor region for providing respective electrical connection to said first and second ends of said elongate magneto-resistive element and said elongate conductive element;

wherein said terminals together form an array which is spaced in a predetermined direction from said elongate sensor region.

21. A magnetic sensor array according to claim 15 wherein said second end of said elongate magneto-resistive element of each of said first and second magnetic sensors are electrically connected in common.

22. A magnetic sensor array according to claim 15 wherein said second end of said elongate conductive element of each of said first and second magnetic sensors are electrically connected in common.

23. A magnetic sensor array according to claim 15 wherein said second end of each of said elongate magneto-resistive element and said elongate conductive element of each of said first and second magnetic sensors are connected in common.

24. A magnetic sensor as claimed in claim 15, further comprising:

a bias current control circuit electrically connected to said elongate magneto-resistive element and said elongate conductive element, said bias current control circuit changing a bias current applied to said elongate conductive member in response to changes in a magneto-resistance of said elongate magneto-resistive element induced by a signal magnetic field applied to said elongate magneto-resistive element, in order to maintain a net magnetic field applied to said elongate magneto-resistive element at a substantially constant level and obtain a measurement of said signal magnetic field by monitoring a level of said bias current.

* * * * *